(12) United States Patent
Gonzalez et al.

(10) Patent No.: US 8,084,322 B2
(45) Date of Patent: Dec. 27, 2011

(54) METHOD OF MANUFACTURING DEVICES HAVING VERTICAL JUNCTION EDGE

(75) Inventors: Fernando Gonzalez, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 205 days.

(21) Appl. No.: 11/440,260

(22) Filed: May 24, 2006

(65) Prior Publication Data

US 2007/0072357 A1 Mar. 29, 2007

Related U.S. Application Data

(62) Division of application No. 10/751,141, filed on Dec. 31, 2003, now Pat. No. 7,230,312.

(51) Int. Cl.
*H01L 21/8242* (2006.01)

(52) U.S. Cl. ......... 438/246; 438/241; 438/242; 438/243

(58) Field of Classification Search .................. 257/510, 257/520, 499, 333, 374, 524, 513, 519, 301; 438/197, 218, 219, 294, 353, 400, 221, 296, 438/246, 241–243

See application file for complete search history.

(56) References Cited

U.S. PATENT DOCUMENTS

| | | | |
|---|---|---|---|
| 5,554,553 A * | 9/1996 | Harari | 438/264 |
| 5,841,150 A | 11/1998 | Gonzalez et al. | |
| 6,087,706 A | 7/2000 | Dawson et al. | |
| 6,096,596 A | 8/2000 | Gonzalez | |
| 6,118,135 A | 9/2000 | Gonzalez et al. | |
| 6,271,566 B1 | 8/2001 | Tsuchiaki | |
| 6,344,388 B1 * | 2/2002 | Oishi et al. | 438/241 |
| 6,429,104 B1 | 8/2002 | Auberton-Herve | |
| 6,445,044 B2 * | 9/2002 | Manning | 257/372 |
| 6,452,246 B1 * | 9/2002 | Komori | 257/506 |
| 6,468,879 B1 | 10/2002 | Lamure et al. | |
| 6,593,624 B2 * | 7/2003 | Walker | 257/344 |
| 6,703,274 B1 * | 3/2004 | Chidambarrao et al. | 438/243 |
| 6,940,145 B2 | 9/2005 | Blair et al. | |
| 6,955,957 B2 * | 10/2005 | Shin | 438/196 |
| 2002/0064912 A1 * | 5/2002 | Komori | 438/221 |
| 2002/0190344 A1 | 12/2002 | Michejda et al. | |
| 2003/0022450 A1 * | 1/2003 | Pan et al. | 438/300 |
| 2003/0025125 A1 * | 2/2003 | Menut et al. | 257/141 |
| 2004/0070023 A1 * | 4/2004 | Kim et al. | 257/315 |
| 2004/0126986 A1 * | 7/2004 | Wise et al. | 438/424 |
| 2004/0201059 A1 * | 10/2004 | Ding | 257/315 |
| 2006/0163631 A1 * | 7/2006 | Chen et al. | 257/296 |

* cited by examiner

*Primary Examiner* — Eugene Lee
(74) *Attorney, Agent, or Firm* — Fletcher Yoder

(57) ABSTRACT

Techniques for forming devices, such as transistors, having vertical junction edges. More specifically, shallow trenches are formed in a substrate and filled with an oxide. Cavities may be formed in the oxide and filled with a conductive material, such a doped polysilicon. Vertical junctions are formed between the polysilicon and the exposed substrate at the trench edges such that during a thermal cycle, the doped polysilicon will out-diffuse doping elements into the adjacent single crystal silicon advantageously forming a diode extension having desirable properties.

15 Claims, 5 Drawing Sheets

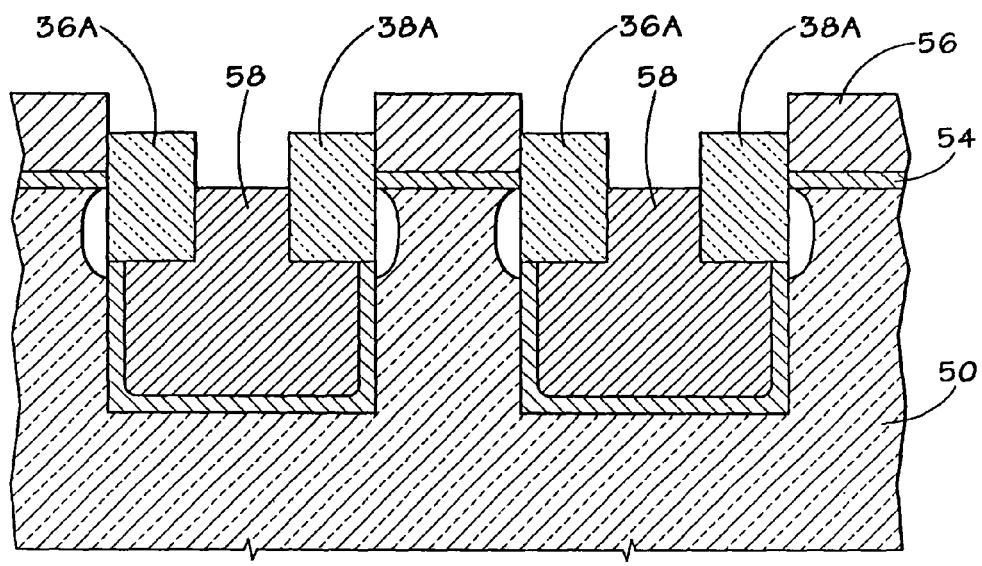
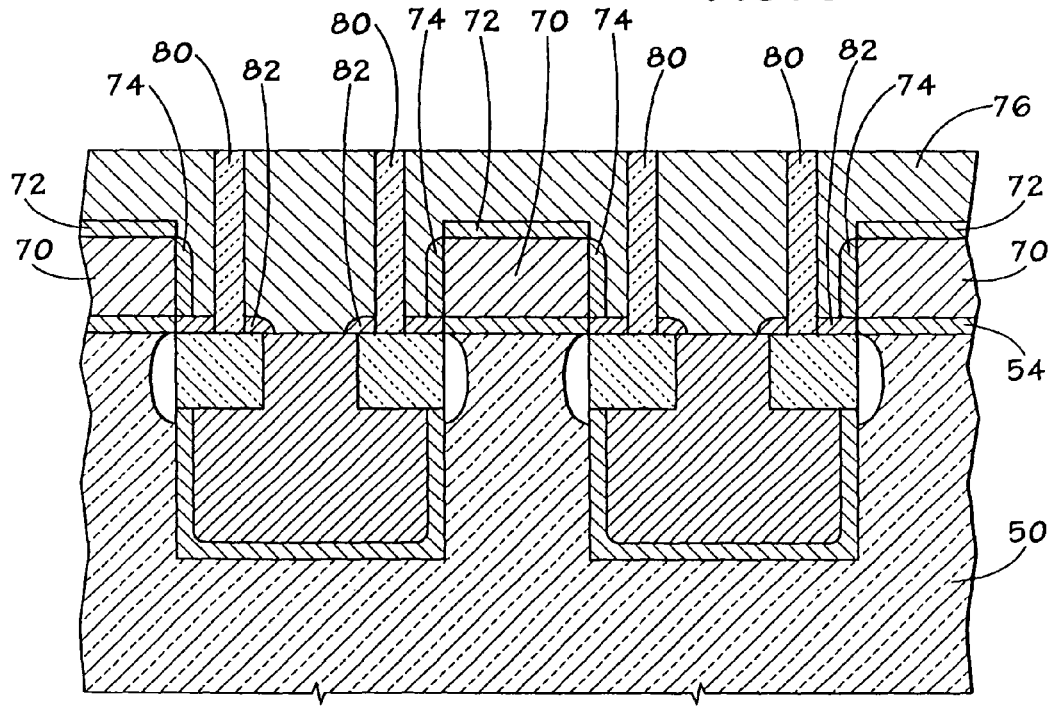

METHOD OF MANUFACTURING DEVICES HAVING VERTICAL JUNCTION EDGE

CROSS-REFERENCE TO RELATED APPLICATION

This application is a divisional of U.S. patent application Ser. No. 10/751,141, which was filed on Dec. 31, 2003 now U.S. Pat. No. 7,230,312.

BACKGROUND OF THE INVENTION

This section is intended to introduce the reader to aspects of the art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The increased speed and capability of computers has had an enormous impact on our society. The Internet, advanced software applications, speech recognition, advances and telecommunications and the many other high speed applications are made feasible only because the performance of silicon-based integrated circuit devices has increased over time. As can be appreciated, faster performance is generally desirable.

Current integrated circuit devices, such as metal oxide semiconductor (MOS) transistors, are limited by constraints inherent in existing silicon technology. For decades, scientists have been searching for ways to enhance existing silicon technology to speed computer performance. As can be appreciated, any medium that can conduct electricity has some degree of capacitance associated therewith. Technically, a MOS transistor is regarded as a capacitive circuit. This implies that the MOS circuit must completely charge to full capacitance to activate its switching capability. The process of discharging and recharging the transistor requires a relatively long amount of time when compared to the time it requires to actually switch the voltage state of the transistor's metal layer. The "junction capacitance" of a transistor generally refers to the charge-storing area between the impurities added to a chip's silicon and the impurity-free silicon substrate. Reducing the junction capacitance associated with the transistor will enhance performance of the device by increasing the operating speed.

Silicon-on-insulator (SOI) is a relatively new technology that offers certain advantages over prior techniques. SOI differs from CMOS by placing the transistor's silicon junction area on top of an electrical insulator. The most common insulators employed with this technique are glass and silicon oxide. By placing a thin layer of insulator between the impurities and the silicon substrate, the junction capacitance is greatly reduced or eliminated, thereby enabling the transistor to operate faster. As transistor latency drops, the ability to process more instructions in a given time increases and overall system performance is positively impacted.

Though SOI technology offers certain advantages over existing silicon technology, further size reduction and cost reduction may be desirable. Further, devices having lower leakage currents and stable refresh rates is also desirable. As can be appreciated, improved manufacturability is often desirable, as well.

BRIEF DESCRIPTION OF THE DRAWINGS

Advantages of the invention may become apparent upon reading the following detailed description and upon reference to the drawings in which:

FIGS. 3-10 are cross-sectional views illustrating exemplary methods of fabricating integrated circuits in accordance with embodiments of the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
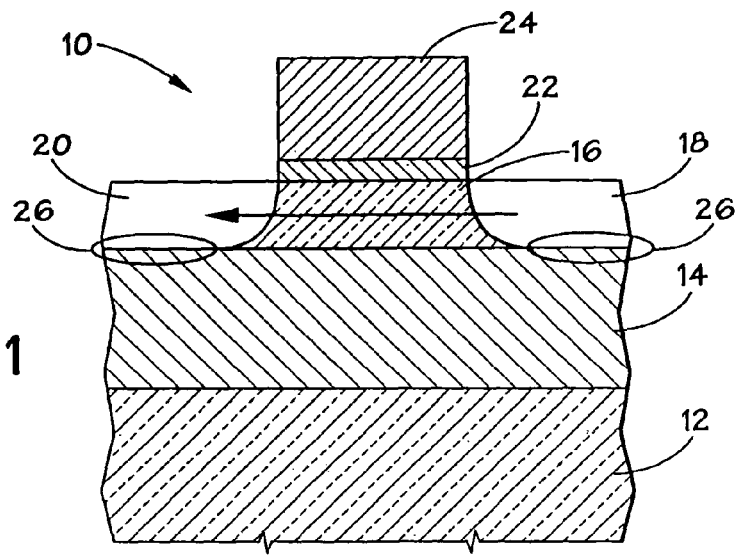
FIG. 1 illustrates a partial cross-sectional view of a transistor fabricated using silicon-on-insulator (SOI) technology.

Turning now to the figures, FIG. 1 illustrates a partial cross-sectional view of a transistor 10 fabricated using silicon-on-insulator (SOI) technology. As previously described, the transistor 10 includes a silicon substrate 12 having an insulator 14, such as an oxide or glass. The gate area (or channel) is formed by disposing a thin layer of silicon 16 on top of the insulator 14 and forming the doped regions 18 and 20 in the thin layer of silicon 16 such that a channel is formed through the thin layer of silicon 16. A thin barrier layer 22, such as an oxide, is disposed over the thin layer of silicon 16 and a conductive layer 24, such as a metal or polysilicon, is disposed on top of the barrier layer 22 and patterned to form a conductive path above the gate area. When current is transmitted to the conductive layer 24, the thin layer silicon 16 forms a conductive channel between the doped regions 18 and 20 through which electricity flows.

As can be appreciated, the interface between the doped regions of a transistor and the underlying layer may have an associated junction capacitance. As previously described, a MOS circuit generally uses a relatively large amount of operational time discharging and recharging this capacitance before the transistor is able to conduct since there is a relatively large capacitance associate with the junction between the pure silicon and the doped silicon. However, the present SOI transistor 10 includes an insulator 14 disposed over the silicon substrate 12. Advantageously, the SOI transistor 10 has a negligible capacitance since the insulator 14 provides an efficient barrier. Accordingly, the capacitance associated with the junction 26 is essentially eliminated by incorporating the insulator layer 14, thus allowing the SOI transistor to operate faster since the charging process is virtually eliminated. As will be described further with reference to FIGS. 3-8, the notion of providing an insulator 14 to minimize the capacitance at the junctions 26 as in the SOI transistor 10, can be implemented with other technologies, such as shallow trench isolation (STI) technology, to provide improved transistor design for incorporation in ultra large scale integration (ULSI) applications of integrated circuits.

Figure 2:
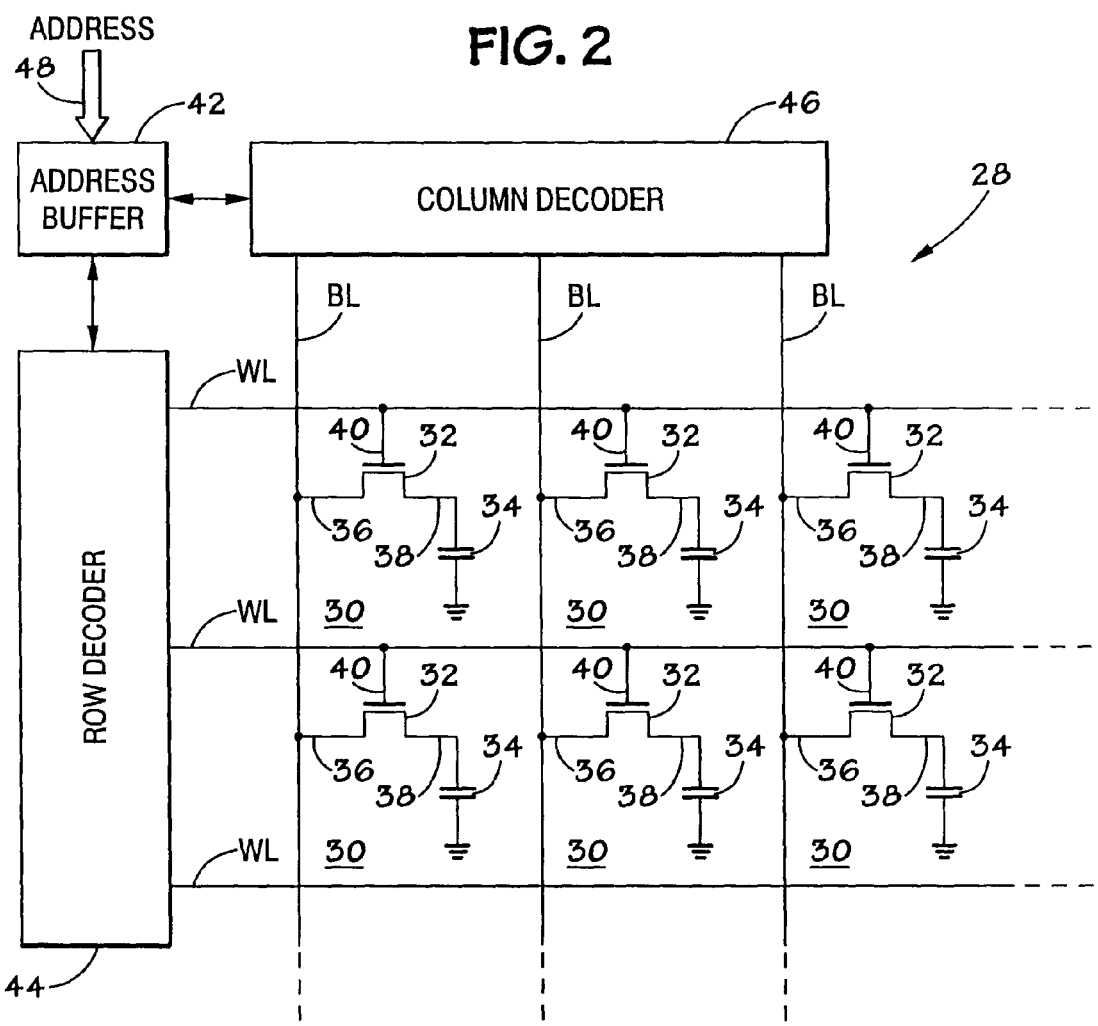
FIG. 2 illustrates a partial schematic illustration of an exemplary integrated circuit, incorporating an array of memory cells having transistors fabricated in accordance with embodiments of the present invention.

Referring to now to FIG. 2, a partial schematic illustration of an exemplary integrated circuit, such as a memory device, incorporating an array of memory cells having transistors which may be fabricated in accordance with the techniques described herein is illustrated. The memory device 28 may be, for example, a dynamic random access memory (DRAM) device. In the exemplary embodiment, the memory device 28 includes a number memory cells 30 arranged in a grid pattern comprising a number of rows and columns. The number of memory cells 30 (and corresponding rows and columns) may vary depending on system requirements and fabrication technology. Each memory cell 30 includes an access device and a storage device. In the present exemplary embodiment, the access device comprises a field effect transistor (FET) 32 and the storage device comprises a capacitor 34. The access device is implemented to provide controlled access to the storage device. In the exemplary memory cell 30, the FET 32 includes a drain terminal 36 and a source terminal 38. The capacitor 34 is coupled to the source terminal 38. The terminal of the capacitor 34 that is not coupled to the FET 32 may be coupled to a ground plane.

It should be noted that although the above description depicts the terminal of the access device coupled to the capacitor 34 as the source 38 and the other non-gate terminal of the access device as the drain 36, during read and write operations, the FET 32 may be operated such that each of the terminals 36 and 38 operates at one time or another as a source or a drain. Accordingly, for purposes of further discussion it should be recognized that whenever a terminal is identified as a source or a drain, it is only for convenience and that in fact during operation of the FET 32 either terminal could be a source or a drain depending on the manner in which the FET 32 is being controlled by the voltages applied to the terminals 36, 38 and 40.

As previously described, the memory array is arranged in a series of rows and columns. To implement the data storage capabilities of a memory cell 30, an electrical charge is placed on the drain 36 of the FET 32 via a bit line (BL). By controlling the voltage at the gate 40 via the word line (WL), a voltage potential may be created across the FET 32 such that the electrical charge at the drain 36 can flow to the capacitor 34. As can be appreciated, by storing electrical charge in the capacitor 34, the charge may be interpreted as a binary data value in the memory cell 30. For instance, for a single-bit storage device, a positive charge above a known threshold voltage may be interpreted as binary "1." If the charge in the capacitor 34 is below the threshold value, a binary value of "0" is said to be stored in the memory cell 30.

The bit lines BL are used to read and write data to and from the memory cells 30. The word lines WL are used to activate the FET 32 to access a particular row of a memory cell 30. Accordingly, the memory device 28 includes an address buffer 42, row decoder 44 and column decoder 46. The row decoder 44 and column decoder 46 selectively access the memory cells 30 in response to address signals that are provided on the address bus 48 during read, write and refresh operations. The address signals are typically provided by an external controller such as a microprocessor or another type of memory controller. The column decoder 46 may also include sense amplifiers and input/output circuitry to further enable data to be read to and from the memory cell 30 via the bit lines BL.

In one exemplary mode of operation, the memory device 28 receives the address of a particular memory cell 30 at the address buffer 42. The address buffer 42 identifies one of the word lines WL of the particular memory cell 30 corresponding to the requested address and passes the address to the row decoder 44. The row decoder 44 selectively activates the particular word line WL to activate the FETs 32 of each memory cell 30 that is connected to the selected word line WL. The column decoder 46 selects the bit line (or bit lines) BL of the memory cell 30 corresponding to the requested address. For a write operation, data received by the input/output circuitry is coupled to the selected bit line (or bit lines) BL and provides for the charge or discharge of the capacitor 34 of the selected memory cell 30 through the FET 32. The charge corresponds to binary data, as previously described. For a read operation, data stored in the selected memory cell 30, represented by the charge stored in the capacitor 34, is coupled to the select bit line (or bit lines) BL, amplified by the sense amplifier and a corresponding voltage level is provided to the input/output circuitry in the column decoder 46.

As can be appreciated, the memory array described in FIG. 2 implements a number of FETs 32. In accordance with the present exemplary embodiments, the FETs 32 may be fabricated using STI technology. Shallow trenches may be formed in a substrate and filled with an oxide. Cavities may be formed in the field oxide and filled with a conductive material, such as polysilicon, as described further below. In the present exemplary embodiments, the FET 32 includes vertical junctions that are fabricated along the transistor gate edge. As described in detail below, the vertical junctions are formed between the polysilcon and the exposed silicon at the trench edges such that the heavily doped polysilicon will out-diffuse doping elements into the adjacent single crystal silicon advantageously forming a diode extension having desirable properties. Because the vertical junctions are in the single crystal silicon substrate and not the polysilicon layer, the diode area is confined to the transistor edge and thus, does not intersect trench walls, the junction leakage is advantageously low. Further, because the junction landing pad (i.e., the polysilicon) is disposed over the isolation oxide, the transistor cell can be compacted while the field isolation trench width is widened to accommodate the source/drain landing pad contact areas, thereby allowing a better fill margin for the trench. Further, the trench can be made shallower since the diode along the trench walls does not extend far below the surface of the shallow trench. As will be appreciated, the exemplary FETs 32 can be compacted further using self aligned contact (SAC) processing.

Figure 3:
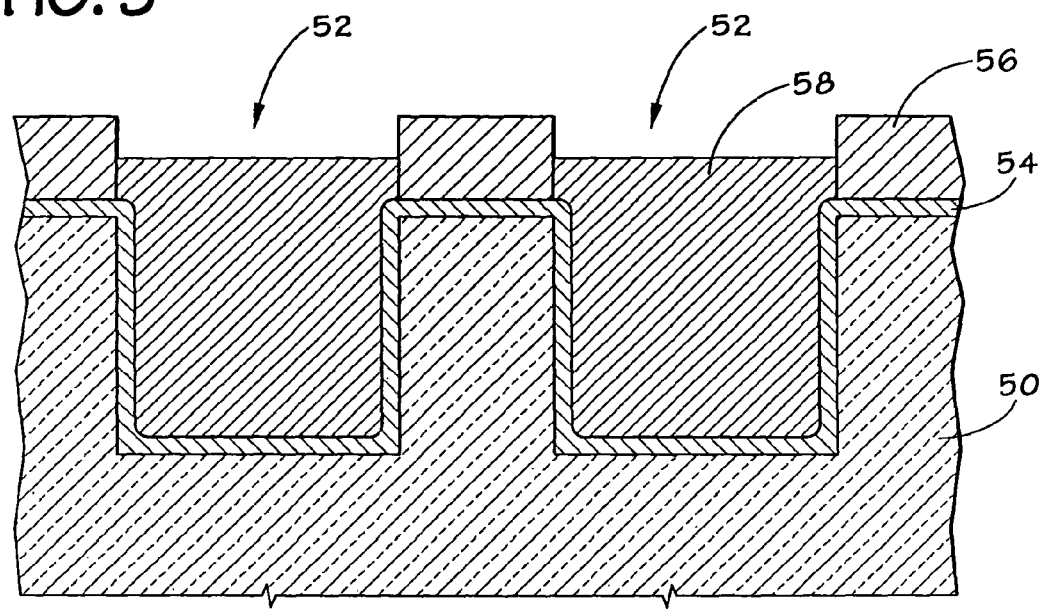

Referring now to FIG. 3, a partial cross sectional view of a substrate 50 having STI trenches 52 fabricated therein is illustrated. The substrate 50 may comprise a p-type silicon (Si) substrate, for instance. As described further below, a FET 32 may be fabricated vertically within the trench 52. The trenches 52 may be formed by any one of a number of wet or dry etching techniques, such as plasma etching, ion beam etching, or reactive ion etching (RIE), for example. The trenches 52 may have a depth in the range of about 0.15 microns to about 0.45 microns, for example. Further, the trenches 52 may have a width in the range of approximately 0.025 microns to 0.015 microns, for example.

The structure illustrated in FIG. 3 includes a thin oxide layer 54, such as silicon dioxide ($SiO_2$) or oxide nitride oxide (ONO), which may be applied or grown on the surface of the substrate 50 by wet or dry oxidation of the semiconductor substrate 50, for instance. The oxide layer 54 may be grown on the surface of the wafer by placing the substrate 50 in a heated chamber and exposing the wafer to oxygen gas, as can be appreciated by those skilled in the art. Alternatively, the oxide layer 54 may be deposited over the substrate 50. The oxide layer 54 is generally a thin layer that forms the gate oxide of the FET 32, as will be illustrated further below.

The structure illustrated in FIG. 3 also includes an intermediate nitride layer 56, such as silicon nitride ($Si_3N_4$), that is deposited onto the oxide layer 54 and patterned, as illustrated in FIG. 3. The nitride layer 56 may be deposited to protect the underlying materials during further processing. The nitride layer may comprise various other common insulating materials such as silicon oxide ($SiO_2$), which may be in combination with the nitride layer 56. The nitride layer 56 may be deposited by chemical vapor deposition (CVD), for example. More specifically, the nitride layer 56 may be disposed using a low pressure chemical vapor deposition (LPCVD).

The techniques for forming the structure illustrated in FIG. 3 may vary. For instance, in one exemplary embodiment, after the trenches 52 are formed in the substrate 50, the oxide layer 54 may be applied to (or grown on) the surface of the substrate 50, including through the trench 52. Alternatively, the oxide layer 54 and the nitride layer 56 may be disposed over the surface of the substrate 50 before the trenches 52 are formed. Once the oxide layer 54 and the nitride layer 56 are disposed, the trenches 52 may be formed through the nitride layer 56, the oxide layer 54 and the underlying substrate 50. As can be appreciated, if the trenches 52 are formed after deposition of the oxide layer 54, the oxide layer 54 will be removed from the trench 52 during the etch process. Accordingly, a second deposition or growth step may be performed to redeposit or regrow the oxide layer 54 through the trench 52. Once the trench 52 is formed having an oxide layer 54 disposed therein, the trenches 52 are filled with an isolation oxide 58, thereby forming the structure illustrated in FIG. 3. The oxide 58 will provide junction isolation for the FET 32, as illustrated further below.

Figure 4:
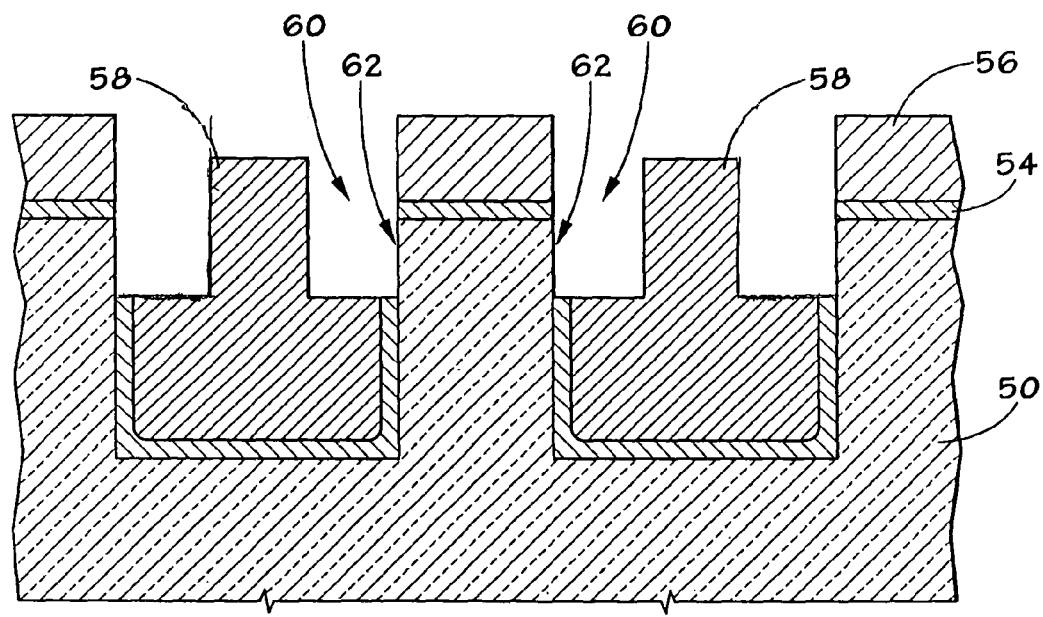

Once the trench 52 is filled with the isolation oxide 58, the oxide 58 may be patterned such that a shallow cavity 60 is formed along the walls of the channel as indicated in FIG. 4. It should be understood that while the term "cavity" is used to describe the opening formed in the oxide 58, the term is simply used for clarity such that it is easily distinguishable from the trench 52. As can be appreciated, the cavity 60 may also be described as a trench formed in the oxide 58 that extends through the length of the trench 52. In the present exemplary embodiment, the isolation oxide 58 may be etched to form an inverted U-shaped cavity, as illustrated in FIG. 4. As will be illustrated further below, the exposed edge 62 will form a diode junctions for the FET 32 having a low junction leakage based on its proximity to the isolation oxide 58. As used herein, the "exposed edge 62" refers to the edge being essentially free of any film, especially oxides and hydrocarbons.

Once the isolation oxide 58 is etched to form the cavity 60 to expose the edge 62, a cleaning process may be implemented to clean the exposed edge 62 to eliminate any films, such as hydrocarbon films, that may be present. After the cleaning process, a conductive material, such as an insitu doped polysilicon (i.e., polysilicon having doping levels in the range of approximately $10^{16}$ to $10^{22}$ atoms/cm$^3$), amorphous silicon or micro-crystal silicon, for example, may be deposited in the channel by a suitable deposition process, such as chemical vapor deposition (CVD), plasma enhanced chemical vapor deposition (PECVD), or photo enhanced CVD, for example. The conductive material may be deposited in a diffusion furnace or using a single wafer tool, for example.

Figure 5:
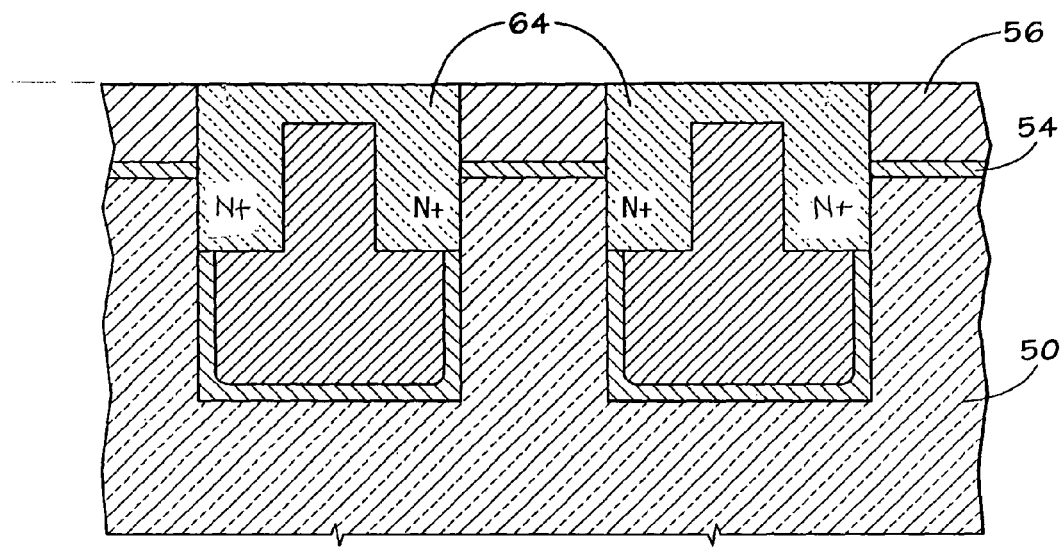

FIG. 5 illustrates the structure formed after deposition of the conductive material, here an N+ doped polysilicon material. Accordingly, the structure illustrated in FIG. 5 includes N+ doped polysilicon 64 disposed in the cavity 60. The polysilicon will be patterned to form the source 36 and drain 38 of the FET 32, as described further below with reference to FIG. 6. Once the polysilicon material 64 is disposed, the structure may be planarized such that the nitride layer 56 is flush with the top surface of the polysilicon material 64, as illustrated in FIG. 5. The structure may be planarized using chemical mechanical planarization (CMP) techniques, for instance.

In an alternate embodiment, the polysilicon material 64 may be disposed conformally within the cavity 60, such that a thin layer of the polysilicon material 64 is formed therethrough. The remainder of the cavity 60 may be filled with a compound, such as $CuSi_2$, $NiSi_2$, $TiSi_2$, TiN or $W_2N$, for example. In another embodiment, the polysilicon material 64 may be replaced completely with a compound, or with a metal that may form a compound through a heat treatment. As will be appreciated, by replacing the polysilicon material 64 with a pure metal, a Schottky barrier may be formed. In this embodiment, the FET 32 may comprise a Schottky barrier transistor having improved gate control and sub-threshold voltage swings. Further, Schottky barrier transistors fabricated in accordance with the present embodiments may provide improved memory cell isolation, reduction in threshold voltage, improvement in drive currents and improved leakage degradation.

After deposition of the conductive material (here the doped polysilicon 64) and CMP, the structure is exposed to a heat treatment. By exposing the heavily doped polysilicon material 64 to a thermal cycle, the doped polysilicon material 64 out-diffuses doping elements into the adjacent single crystal silicon, thereby forming diode extensions for the FET 32, as indicated by the doped regions 68 illustrated in FIG. 6. The lateral diffusion of the polysilicon material 64 may be controlled by controlling the temperature and the time of the thermal cycle such that the depth of the junction is not affected. The exposure time for the thermal cycle is in the range of approximately 20 to 600 seconds and at a temperature in the range of approximately 600° C. to 1050° C. Once the out-diffused doped regions 68 are formed in the silicon, the isolation oxide 58 and the polysilicon material 64 are further etched to form the drain 36 and the source 38 and indicated in FIG. 6.

In an alternate exemplary embodiment, the polysilicon material 64 may be etched to form a raised source 38A and drain 36A configuration, as illustrated in FIG. 7. As can be appreciated, the raised source 38A and drain 36A configuration illustrated in FIG. 7 may advantageously provide a lower resistance and faster switching speeds for the FET 32. Those having ordinary skill in the art will appreciate that additional patterning and etching steps may be implemented to form the alternative structure having the raised source 38A and drain 36A of FIG. 7. For instance to complete processing of the structure including the raised source 38A and drain 36A configuration, a dielectric film may be deposited and patterned to isolate the polysilicon material 64 which forms the raised source 38A and drain 36A from the polysilicon material that will be later deposited to form the polysilicon gate 70 (illustrated and described below with reference to FIG. 8).

Figure 6:
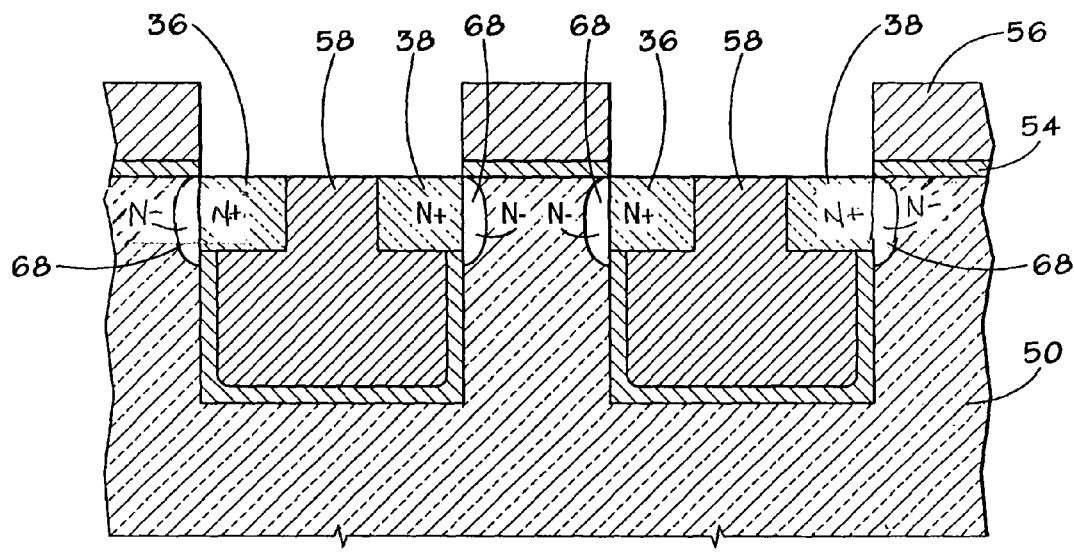

Returning again to the structure illustrated in FIG. 6, having a source 38 and drain 36 patterned flush with the oxide layer 58, further fabrication of the FET 32 includes a number of deposition, patterning and removal steps. For instance, after the formation of the source 38 and drain 36, the nitride layer 56 may be removed via a chemical etch process such that the gate structures and surrounding materials may be disposed and etched. If the oxide layer 54 is removed during the etch process, the oxide layer 54 may then be regrown to provide the gate oxide for the FET 32. During the regrowth of the gate oxide layer 54, the oxide layer 82 is also formed over the polysilicon layer 58 (source 38 and drain 36), as illustrated in FIG. 8. Next, the wordline structures implemented to form the gate 40 of the FET 32 may be fabricated. In one exemplary embodiment, the wordlines comprise a polysilicon gate 70 having a silicide material and a nitride cap, such as $Si_3N_4$, disposed thereon, illustrated collectively in FIG. 8 as the cap 72. As can be appreciated, the polysilicon gate 70 may comprise other conductive materials, such as tungsten, to enhance conductivity through the polysilicon gate 70. Further, the cap 72 may also comprise various common insulating materials such as silicon oxide ($SiO_2$). The layers of the cap 72 may be deposited by chemical vapor deposition (CVD), for example. More specifically, the cap 72 may be disposed using a low pressure chemical vapor deposition (LPCVD).

Once the wordline layers (i.e., oxide 54, polysilicon gate 70 and cap 72) are disposed, the wordlines may be patterned and etched by a conventional means. Next, a nitride layer may be disposed and etched to form the nitride spacers 74. After formation of the nitride spacers 74, a number of dielectric layers, such as TEOS and BSPG layers, illustrated collectively as dielectric layers 76, may be disposed over the wordline stacks, thereby burying the wordlines. The structure may then be planarized by chemical mechanical planarization (CMP). Next contact holes are formed through the BPSG layers such that openings to the drain 36 and source 38 are formed. Finally, a conductive material, such as a polysilicon plug 80 may be disposed into the holes to provide contacts to the source and drain and metal trace layers (not shown) may be formed on the surface of the dielectric layers 76. The formations of the contact holes may include multiple etch and/or punch steps. For instance, one or more punch steps and/or one or more etch steps, such as a dry etch, may be implemented to etch through the dielectric layers 76 to the underlying source 38 and drain 36. Advantageously, the techniques described herein allow the plugs 80 to be disposed further from the polysilicon gate 70 since the width of the source 38 and drain 36 may be increased. By moving the plugs 80 further from the gate 70, shorting between the plugs 80 and the gate 70 may be reduced.

For the raised source/drain configuration illustrated in FIG. 7, slightly different processing steps may be implemented. In one embodiment, after formation of the raised source 38A and drain 36A, the nitride layer 56 may be removed via a chemical etch process. Further, the oxide 54 is etched. Next, a dielectric material, such as an oxide or a nitride or high k materials, may be deposited and patterned to surround the raised source 38A and drain 36A. Next, the polysilicon gate 70 (FIG. 8) may be deposited and planarized by a CMP process, for example. Finally, a silicide material and nitride cap may be deposited over the polysilicon gate 70, as previously described.

As can be appreciated, to provide electrical contact from the underlying wordlines, contact holes (not shown) may also be formed to the underlying wordline. The contact holes may be filled with a conductive material, such as tungsten, to provide a conductive path from the metal traces to the polysilicon gate 70 (i.e., wordline gate 40 in FIG. 2.

The application of the present techniques of forming cavities within an oxide disposed in a trench may also be implemented to form connections having extended vertical contact regions. Referring briefly to FIG. 4, the cavity 60 has been formed in the P-type silicon substrate 50. To provide connections along the exposed edge 62, a P+ doped polysilicon may be deposited into the cavity 60, as opposed to the N+ doped polysilicon material 64 implemented to form the transistor junctions, as described above. Further, in some applications, it may be desirable to form connections on one side of the trench 52 (FIG. 3) and to form diode/transistor junctions on the opposite side of the trench 52. The formation of such structures is described briefly with reference to FIGS. 9 and 10, below.

Figure 9:
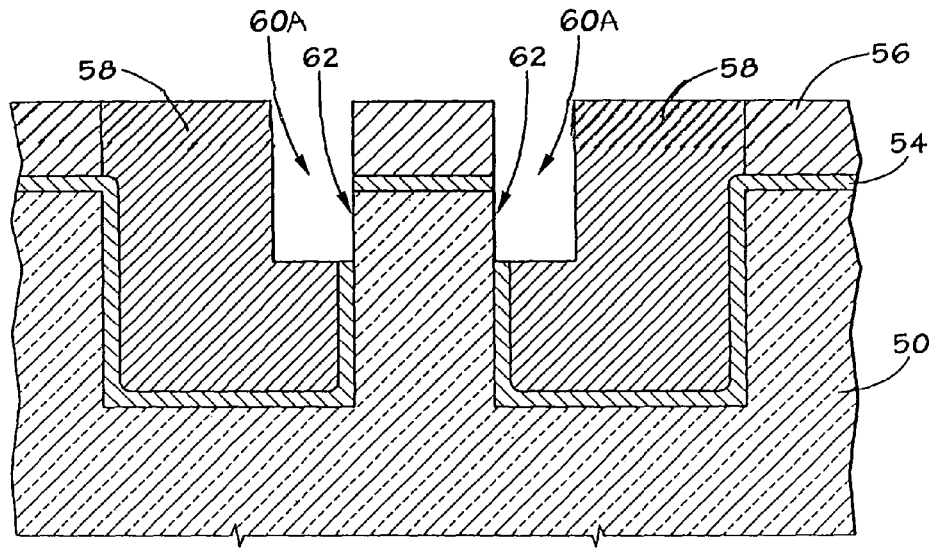

As will be appreciated, to facilitate the formation of two structures (i.e., connections and diode/transistor junctions) within a single trench 52, separate cavities may be formed in the isolation oxide and different dopants may be deposited on each side. Referring to FIG. 9, a first cavity 60A is formed in the isolation oxide 58 along one edge of the trench 52. It should be noted that to provide isolation between the cavity 60A and the cavity that will be formed later on the opposite side of the trench 52, the isolation oxide 58 may be patterned and etched such that it is flush with the top surface of the nitride layer 56, as illustrated in FIG. 9. In the present exemplary embodiment, after formation of the first cavity 60A, an N+ polysilicon material, such as phosphorus, may be disposed into the cavity 60A. After deposition of the N+ polysilicon material into the cavity 60A, a similar set of steps may be implemented and a polysilicon material heavily doped with a p-type material, such as boron, may be deposited in similar cavities formed on the opposite side of the trench 52.

Figure 10:
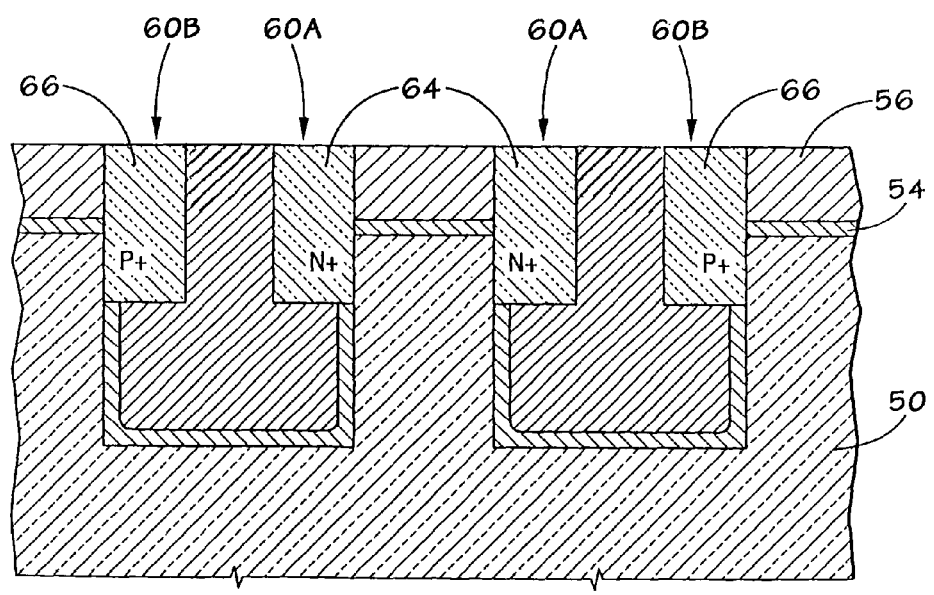

FIG. 10 illustrates the structure formed after deposition of both polysilicon materials. Accordingly, the structure illustrated in FIG. 10 includes n-doped polysilicon 64 disposed in a cavity 60A formed on one side of the trench 52 and a p-doped polysilicon 66 disposed in a cavity 60B formed on the other side of the trench 52. By exposing the doped polysilicon materials 64 and 66 to a thermal cycle, the doped polysilicon materials 64 and 66 will out-diffuse doping elements into the adjacent single crystal silicon, thereby forming either a diode extensions, as with polysilicon material 64 or a connection, as with polysilicon material 66. Once each of the polysilicon materials 64 and 66 are disposed, the structure may be planarized such that the nitride layer 56 is flush with the top surface of the polysilicon materials 64 and 66, as previously described with reference to FIG. 5. As will be appreciated, depending on the application, the connections and diode extensions may be patterned and further fabricated to provide any of a number of desirable structures having improved junctions.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method comprising:
   forming a trench in a substrate, wherein the substrate is a p-type or n-type semiconductor material;
   disposing an isolation oxide into the trench;
   forming a first cavity in the isolation oxide along and in contact with the substrate at a first edge of the trench;
   forming a second cavity in the isolation oxide along and in contact with the substrate at a second edge of the trench;
   disposing a heavily doped polysilicon into each of the first cavity and the second cavity; and
   thermal cycling the substrate such that ions from the heavily doped polysilicon diffuse into the substrate.

2. The method, as set forth in claim 1, wherein forming the trench comprises etching the trench having an aspect ratio of less than or equal to approximately 0.5 to 10.

3. The method, as set forth in claim 1, wherein forming the trench comprises etching the trench having an aspect ratio of less than or equal to approximately 1 to 3.

4. The method, as set forth in claim 1, wherein forming the first cavity and forming the second cavity occur contemporaneously.

5. The method, as set forth in claim 1, wherein disposing a heavily doped polysilicon comprises:
 disposing a p-type polysilicon into the first cavity; and
 disposing an n-type polysilicon into the second cavity.

6. The method, as set forth in claim 1, wherein thermal cycling comprises thermal cycling at a temperature in the range of approximately 600° C. to 1050° C.

7. The method, as set forth in claim 1, wherein thermal cycling comprises thermal cycling for a length of time in the range of approximately 20 to 600 seconds.

8. A method comprising:
 forming a trench in a substrate, wherein the trench is defined by a first and second exposed edge in the substrate;
 filling the trench with an isolation oxide;
 forming a cavity in the isolation oxide along and exposing each of the first and second exposed edge; and
 filling the cavity along and in contact with each of the first and second exposed edge with one or more conductive materials.

9. The method, as set forth in claim 8, wherein forming the cavity in the isolation oxide comprises forming a cavity having a depth in the range of approximately 300 angstroms to 1500 angstroms.

10. The method, as set forth in claim 8, wherein forming the cavity comprises forming a cavity having an inverted U-shape.

11. The method, as set forth in claim 10, wherein the U-shaped cavity is formed such that the cavity is formed along each of the first and second exposed edge.

12. The method, as set forth in claim 8, wherein filling the cavity comprises filling the cavity with a doped polysilicon.

13. A method comprising:
 forming a trench in a substrate, wherein the trench is defined by a first and second exposed edge in the substrate;
 filling the trench with an isolation oxide;
 forming a cavity in the isolation oxide along and exposing each of the first and second exposed edge;
 filling the cavity along and in contact with each of the first and second exposed edge with one or more conductive materials; and
 removing an upper portion of the conductive material such that a first region of conductive material is formed along the first exposed edge and a second region of conductive material is formed along the second exposed edge, and wherein the first and second regions are isolated from one another.

14. The method, as set forth in claim 13, wherein the first region comprises a first raised region and wherein the second region comprises a second raised region.

15. A method comprising:
 forming a trench in a substrate, wherein the trench is defined by a first and second exposed edge in the substrate;
 filling the trench with an isolation oxide;
 forming a cavity in the isolation oxide along and exposing each of the first and second exposed edge;
 filling the cavity along and in contact with each of the first and second exposed edge with doped polysilicion; and
 thermal cycling the substrate such that ions from the doped polysilicon diffuse into the substrate to form doped regions.

* * * * *

UNITED STATES PATENT AND TRADEMARK OFFICE
CERTIFICATE OF CORRECTION

PATENT NO. : 8,084,322 B2
APPLICATION NO. : 11/440260
DATED : December 27, 2011
INVENTOR(S) : Fernando Gonzalez et al.

Page 1 of 1

It is certified that error appears in the above-identified patent and that said Letters Patent is hereby corrected as shown below:

In column 10, line 30, in Claim 15, delete "polysilicion;" and insert -- polysilicon; --, therefor.

Signed and Sealed this
Sixth Day of March, 2012

David J. Kappos
*Director of the United States Patent and Trademark Office*